United States Patent [19]

Angulas et al.

[11] Patent Number: 5,133,495
[45] Date of Patent: Jul. 28, 1992

[54] METHOD OF BONDING FLEXIBLE CIRCUIT TO CIRCUITIZED SUBSTRATE TO PROVIDE ELECTRICAL CONNECTION THEREBETWEEN

[75] Inventors: Christopher G. Angulas, Endicott; Patrick T. Flynn, Owego; Thomas E. Kindl, Endwell; Orr Randy L., Vestal, all of N.Y.

[73] Assignee: International Business Machines Corporation, Armonk, N.Y.

[21] Appl. No.: 745,139

[22] Filed: Aug. 12, 1991

[51] Int. Cl.$^5$ .............................................. H05K 3/34
[52] U.S. Cl. .................. 228/180.1; 228/215; 228/248
[58] Field of Search ................ 228/118, 180.1, 180.2, 228/215, 248, 179

[56] References Cited

U.S. PATENT DOCUMENTS

| | | |
|---|---|---|
| 3,320,658 | 5/1967 | Bolda et al. . |
| 3,396,894 | 5/1965 | Ellis . |
| 3,458,925 | 1/1966 | Napier et al. . |
| 3,871,015 | 3/1975 | Lin et al. . |
| 4,050,621 | 9/1977 | Bouley . |
| 4,064,552 | 12/1977 | Angelucci et al. . |
| 4,205,099 | 5/1980 | Jones et al. . |
| 4,273,859 | 6/1981 | Mones . |
| 4,354,629 | 10/1982 | Grassauer . |
| 4,545,610 | 10/1985 | Lakritz et al. . |
| 4,604,644 | 5/1986 | Beckham et al. . |
| 4,605,153 | 8/1986 | Van Den Brekel et al. . |
| 4,739,917 | 4/1988 | Baker . |
| 4,761,881 | 8/1988 | Bora et al. . |
| 4,774,633 | 9/1988 | Dehaine et al. . |
| 4,914,551 | 4/1990 | Anschel et al. . |
| 4,914,814 | 4/1990 | Behun et al. . |
| 4,950,623 | 8/1990 | Dishon . |
| 4,967,950 | 11/1990 | Legg et al. ........... 228/180.2 |
| 5,048,747 | 9/1991 | Clark et al. .......... 228/180.2 |
| 5,057,969 | 10/1991 | Ameen et al. ........ 361/386 |

OTHER PUBLICATIONS

IBM Technical Disclosure Bulletin, vol. 20, No. 12, May/1978, "Permalloy Solder Barrier For Devices With Gold Conductor Metallization", by Ahn et al.
IBM Technical Disclosure Bulletin, vol. 32, No. 10B, Mar./1990, "Controlled C-4 Solder Joint Elongation For Improved Thermal-Mechanical Stress Relief", by Spalik.

Primary Examiner—Samuel M. Heinrich
Attorney, Agent, or Firm—Lawrence R. Fraley

[57] ABSTRACT

A method of bonding a flexible circuitized substrate to a circuitized substrate (e.g., printed circuit board) to interconnect selected circuitry of both substrates using solder. Solder paste is applied over conductive pads on the circuitized substrate and organic dewetting material (e.g., epoxy coating) adjacent thereto. The flexible substrate, having conductors located within and/or traversing an aperture in the flexible substrate's dielectric, is positioned above the solder paste and heat is applied (e.g., in an oven). The paste, dewetting from the organic material, forms a substantially spherical ball and connects to the flexible circuit's conductor, connecting the two. In an alternative embodiment, the solder ball is formed to its desired shape and cooled (to solidification), separate from the flexible circuitized substrate. The flexible substrate is then lowered until the conductor engages the solder ball's upper surface. Heat is then applied to bond solder and conductor.

15 Claims, 4 Drawing Sheets

METHOD OF BONDING FLEXIBLE CIRCUIT TO CIRCUITIZED SUBSTRATE TO PROVIDE ELECTRICAL CONNECTION THEREBETWEEN

TECHNICAL FIELD

This invention relates to the provision of electrical connections between two circuit members, particularly where one of these is a flexible circuit which may be utilized in an electronic package or the like. As used therein, such flexible circuits are also referred to as flexible thin film carriers.

CROSS-REFERENCE TO RELATED APPLICATION

In Ser. No. (S.N.) 07/578,711, filed Sept. 7, 1990 and entitled, "Thin Film Electronic Device" (inventors: J. G. Ameen et al), there is defined a method of forming electrical connections, using solder, between a flexible film carrier and a semiconductor device (e.g., chip) wherein hot gas (e.g., nitrogen) is directed through a screen member to heat bridging leads in the flexible carrier to in turn cause these to heat the respective solder mounds to which these leads are engaged. The resulting structure may form part of an electronic package. This application is assigned to the same assignee as the present invention, and is incorporated herein by reference Ser. No. 07/578,711 is now U.S. Pat. No. 5,057,969.

In Ser. No. 07/743,970, filed Aug. 12, 1991 and entitled "Method Of Bonding Flexible Circuit To Circuitized Substrate To Provide Electrical Connection Therebetween Using Different Solders" (inventors C. G. Angulas et al), there is defined a method of bonding a pair of substrates wherein two solder materials, each of a different melting point, are used.

BACKGROUND OF THE INVENTION

Electronic packages which include at least one thin film, flexible circuit member as an integral part thereof are known in the industry, with examples being defined in U.S. Pat. Nos. 4,849,856 (J. Funari et al) and 4,914,551 (M. Anschel et al), both of which are assigned to the same assignee as the instant invention. In a more recent patent, also assigned to the same assignee as the present invention, there is defined a more specific example of such a flexible thin film carrier. See U.S. Pat. No. 4,937,707 (D. G. McBride et al). As mentioned therein, a main objective in the design of such circuit members and electronic packages is to provide these with as high current densities as possible within a minimum of space. Such miniaturization efforts, while providing several highly advantageous features, also present various engineering problems in both the manufacture and operation of these structures. In the aforementioned U.S. Pat. Nos. 4,849,356 and 4,914,551, for example, solutions to assure effective package heat removal during operation as well as facilitating package assembly are defined. The above three patents are incorporated herein by reference.

One particular problem facing designers of electronic packages containing thin film circuit structures is the essential requirement to provide sound electrical connections between the relatively large number of extremely small conductive elements (e.g., signal and/or ground) of the flexible circuit and the respective conductor locations at the circuitized substrate (e.g., printed circuit board to which the flexible circuit (and the chip thereon) is electrically coupled. As will be defined herein, the present invention defines a method of forming such electrical connections between a flexible circuit and such a substrate for use within structures such as electronic packages in order that relatively high circuit densities are attained. As will be further defined, such connections and the resulting structure are accomplished using solder. Even more particularly, these connections are achieved without use of a separate chemical flux or the like.

As is known, soldering represents a common technique for joining various objects together, including thin film and other circuits, as well as between flexible circuits and electronic devices (chips). Typically, the conductive portions of these structures (usually metallic, e.g., copper) have been coated with a chemical flux prior to joining. Solid solder is then placed between the flux-coated objects or a flux-filled solder paste is screen-printed onto one of the conductive portions and heated to a molten state such that the molten solder coats the portions of these objects which in turn have been coated with such flux. Thereafter, the molten solder is cooled to form a joint between the two objects.

In microelectronic applications (e.g., for electronic package structures as defined herein), solder bonds are commonly used. In one technique, an electronic device (semiconductor chip) is mounted onto a packaging substrate (thin film structure) in a "flip-chip" orientation. In this orientation, the surface of the chip having contact locations is positioned facing the flexible, thin film circuit member. The contact locations on the chip and the respective thin film conductive elements are electrically connected using solder structures, also referred to as controlled collapse chip connections (C4's).

In the aforementioned, U.S. Pat. No. 5,057,969 the method defined therein represents a significant improvement in providing flexible circuit-semiconductor device connections. Use of flux has been substantially eliminated. The method defined in U.S. Pat. No. 4,937,006, also assigned to the same assignee as the present invention, represents yet another improvement over existing and other previous techniques, primarily through effective gas direction control onto the respective solder mounds which form part of the connections being formed. U.S. Pat. No. 4,937,006 is also incorporated herein by reference.

As defined below, the present invention provides another significant improvement over currently known soldering techniques for performing electrical connections in miniaturized electronic packages. The method as defined herein assures sound, effective electrical connections between extremely small circuit members, particularly those found on the package's circuit and the circuitized substrate (printed circuit board) to which it is to be bonded and electrically coupled. The defined method is relatively safe and can be adapted to mass production techniques, thus reducing the overall cost of such a final package structure.

It is believed that a method of providing electrical interconnections between two circuitized substrates (e.g., a thin film flexible circuit and a printed circuit board) possessing the several advantageous features described herein would constitute a significant advancement in the art, including particularly the art of electronic packages in which such substrates are particularly suited for use.

DISCLOSURE OF THE INVENTION

It is, therefore, a primary object of the present invention to enhance the art of electrical connections between circuit members, and particularly the art of electronic packaging wherein such members may be utilized.

It is a further object of the invention to provide a method of forming sound, effective electrical connections between flexible film circuitized substrates (carriers) and an associated circuitized substrate for possible eventual use within an electronic package, wherein such connections can be accomplished in a safe and expeditious manner.

It is yet another object of the invention to provide a method as stated above which provides such connections in high circuit density configurations to thus substantially meet the miniaturization demands in today's packaging industry.

In accordance with one aspect of this invention, there is provided a method of bonding a pair of circuitized substrates to provide sound, effective electrical interconnection therebetween wherein the method involves the steps of providing at least one conductive pad on a first substrate comprised of an organic dielectric material, providing a quantity of organic dewetting material of a predetermined configuration substantially adjacent this conductive pad, applying a quantity of solder paste over the conductive pad and at least part of the organic dewetting material, aligning a second substrate including a dielectric material having an aperture therein and at least one conductor located within and/or bridging said aperture relative to the first substrate such that the conductor is oriented adjacent the solder paste and at a spaced distance therefrom, the second substrate being flexible in nature, heating both first and second substrates to a temperature sufficient to cause the solder paste to dewet from the organic dewetting material and engage the conductor of the second substrate, and thereafter cooling the solder to form an electrical interconnection and bond between both substrates.

In accordance with another aspect of the invention, a method for bonding two circuitized substrates to electrically interconnect same is provided wherein the method involves the steps of providing at least one conductive pad on a first substrate comprised of an organic dielectric material, providing a quantity of organic dewetting material of a predetermined configuration substantially adjacent the conductive pad, applying a quantity of solder past over the conductive pad and at least part of the organic dewetting material, heating the first substrate to a temperature sufficient to cause the solder paste to dewet from the organic dewetting material and form a predetermined shape, aligning a second substrate including a dielectric material having an aperture therein and at least one conductor located within and/or bridging the aperture relative to the first substrate such that the conductor engages the solder formed to the predetermined shape, the second substrate being flexible in nature, heating the solder at the location of engagement with the conductor to cause the solder at the location to become molten and further engage the conductor, and thereafter cooling the solder to form an electrical interconnection and bond between both substrates.

BEST MODE FOR CARRYING OUT THE INVENTION

For a better understanding of the invention, together with other and further objects, advantages and capabilities thereof, reference is made to the following disclosure and appended claims in connection with the above-described drawings.

In FIGS. 1-4, there are shown the various steps of bonding a pair of circuitized substrates to provide a sound, effective electrical connection therebetween in accordance with one embodiment of the invention. As understood from the teachings herein, the invention is able to provide several such connections in a substantially simultaneous manner, if desired. Only one such connection will be described herein, for illustration purposes.

As also defined herein, the invention is particularly directed to the bonding of a flexible, thin film circuitized substrate to a more rigid, circuitized substrate, a particular example of the latter being a printed circuit board. It is to be understood, however, that the invention is not limited to attachment to printed circuit boards, in that other circuitized substrates, including known ceramic substrates, may be employed.

By the term "flexible circuit" as used herein is meant to define a flexible substrate of at least one layer of dielectric material (e.g., polyimide) having at least one conductive layer thereon. Examples of such thin film flexible substrates, particularly those ideally suited for utilization in electronic packages, are defined in the aforementioned U.S. Pat. Nos. 4,849,356, 4,914,551 and 4,937,707, all of which are assigned to the same assignee as the present invention. More recent versions of such substrates may include at least one additional conductive layer as part thereof (as in U.S. Pat. No. 4,937,707), and it is understood that such a circuit member may be utilized in the present invention.

Figure 1:
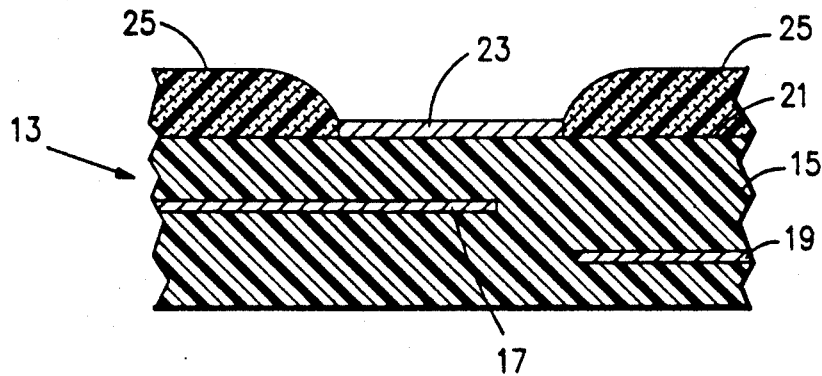
FIGS. 1-4 represent the various steps in bonding a pair of circuitized substrates to provide an electrical connection therebetween in accordance with one embodiment of the invention.
Figure 2:
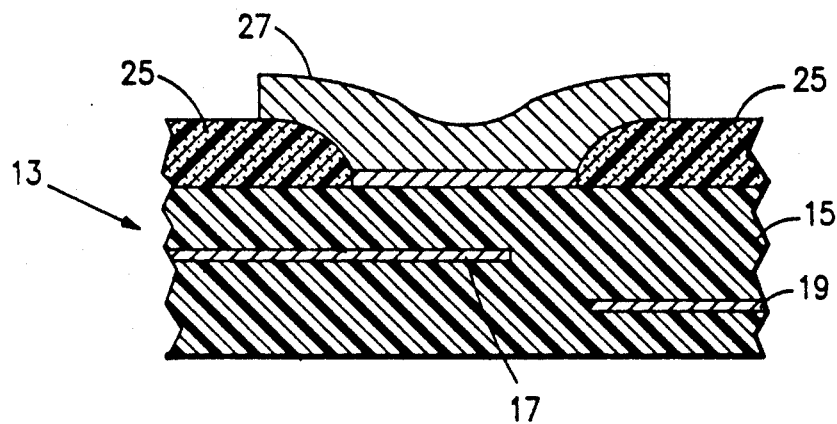

In FIG. 1, there is shown a first circuitized substrate 13 for use in the present invention. Circuitized substrate 13 includes a dielectric 15, preferably of a type known in the art. As stated above, the first circuitized substrate may comprise a printed circuit board, and thus the dielectric 15 is of a material, e.g., fiberglass reinforced epoxy resin, as typically used therein. Additionally, the invention is adaptable to printed circuit boards of the multilayered variety including therein a plurality of electrically conducting layers 17 and 19, which layers are also of a material (e.g., copper) known in the art. Printed circuit boards of this type are well known, as are the processes for making same, and further definition is not believed necessary. Such structures may include many more electrically conductive layers than those depicted in FIGS. 1–4 and 8–10, depending on the desired operational characteristics of the end product using these structures. As is known, such electrically conductive layers may function as signal, power and/or ground layers. As is understood, the aforementioned dielectric material (e.g., fiberglass reinforced epoxy resin) is an organic dielectric material.

Figure 4:
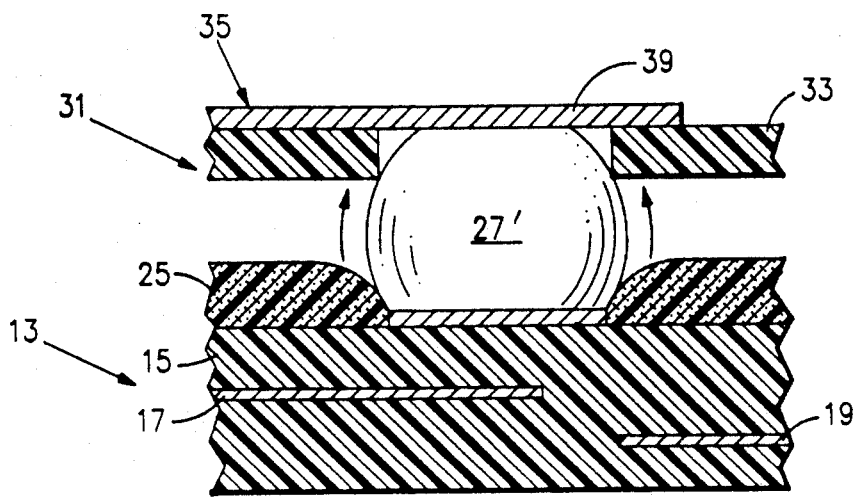

On an upper surface 21 of substrate 13, there is positioned at least one conductive pad 23 which, as defined herein, will eventually be electrically connected to an associated electrical conductor which forms part of a flexible circuitized substrate (FIG. 4). Conductive pad 23 is preferably copper or similar highly conductive material, as is known in the art. Conductive pad 23 is preferably positioned on substrate 13 by known deposition techniques, a preferred such technique being plating or lamination (e.g., laminating copper sheet material to the dielectric at elevated temperatures and pressure). As stated, the invention is adapted for providing a plurality of electrical connections in a simultaneous manner between the described two substrates. In one example, a total of about 500 conductive pads 23 were applied to the upper surface 21 of substrate 13. Significantly, pads 23 can be in any pattern, including, for example, a substantially square pattern with approximately 0.050 inch spacing therebetween. Other patterns are of course also acceptable. These patterns, understandably, are considered of very high density. Understandably, each of these will be electrically connected to a respective conductor within the flexible circuitized substrate being joined. Further description is also provided below.

With pad 23 in place, the next step involves application of an organic solder dewetting material 25 adjacent pad 23. The preferred dewetting material is an organic material, with one example being a photosensitive, lacquer-forming substance capable of being applied in liquid form atop substrate 13 and subsequently cured. One particular example of such a material is Probimer 52, available from the Ciba-Geigy Corporation. (Probimer is a registered trademark of the Ciba-Geigy Corporation.) Probimer 52 is a liquid applied cinnamate/epoxy composition containing light sensitive chalcone groups and a thermal hardener for curing the epoxide groups. It may be conformally applied at approximately 38 percent solids and containing approximately 20 to 25 percent by weight resins of an inert organic filler such as magnesium silicate. It is to be understood that the invention is not limited to this particular material in that other organic dewetting materials may be utilized. Attention is also directed to U.S. Pat. No. 4,544,623 wherein photosensitive protective coatings for use on circuit boards are defined. U.S. Pat. No. 4,544,623 is incorporated herein by reference.

With dewetting material 25 in position adjacent (and, as shown in the drawings, contiguous) pad 23 and subsequently cured, the next step in the method of the invention involves application of a quantity of solder paste 27 to substantially cover the entire upper surface of pad 23 and portions of dewetting material 25. As shown in FIGS. 1–4, and 8–10, the organic dewetting material 25 is of substantially curvilinear shape at the location nearest the outer edges of pad 23. Additionally, the dewetting material 25 is also slightly thicker than the pad, particularly at these immediately adjacent locations.

The preferred solder paste is 63:37 tin-lead solder, although the invention is not limited to this particular type. By the term 63:37 tin-lead solder is meant to define a solder composition which comprises about 63 percent tin and about 37 percent lead. A typical example of this type of paste is 80% solder solids and 20% flux paste, although this application is not limited to this ratio. Solder paste 27, as stated, is applied in paste-like form, preferably using a screening procedure known in the art. During such a procedure, a screen made of a compatible material (e.g., stainless steel) is aligned to and placed in contact with pads 23 on sustrate 13. Thickness of the screen and sizes of openings in the screen correspond to and define the desired thickness and area of solder paste. Solder paste is dispensed onto the screen, and a suitable squeegee type device is dragged across the screen, forcing the paste through the holes in the screen and into contact with pads 23. The screen is then removed, leaving the desired quantity of paste 27 on each pad 23.

Figure 5:
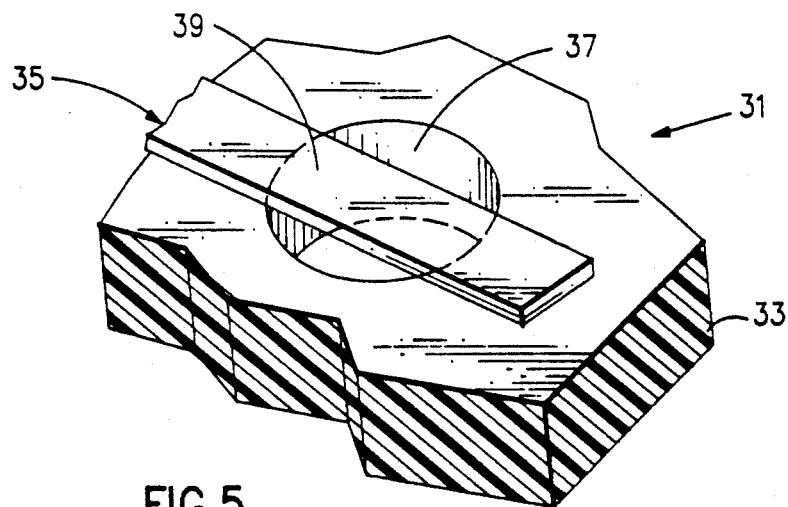
FIG. 5 illustrates, in perspective, one of the second substrate's conductors bridging across an aperture within the substrate's dielectric.
Figures 6, 7:
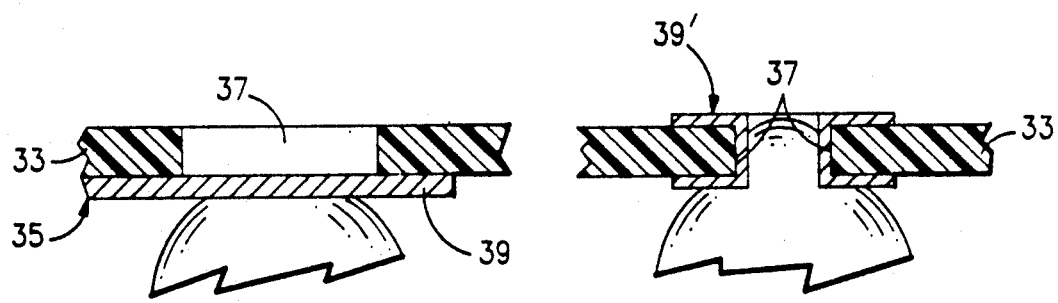
FIGS. 6 and 7 represent alternative embodiments of second substrates, and particularly the conductors which may be used therein, which may be used in the present invention.

With paste 27 in place, the next step of the invention (FIG. 3) involves strategically positioning of a thin flexible circuitized substrate 31 above and at a spaced distance from paste 27 (as well as substrate 13). Preferably, this substrate 31 is located in a substantially parallel manner relative to the substantially planar substrate 13. A preferred device for use in aligning these two substrates is defined hereinbelow with respect to the description of FIG. 11. As mentioned, substrate 31 includes a dielectric material 33, (e.g., polyimide) having a conductive layer 35 (e.g., copper) thereon. Significantly, the flexible substrate 31 includes an aperture 37 therein, which aperture must align strategically with respect to paste 27. In one example of the invention, aperture 37 and the corresponding conductive pad 23 were both of substantially cylindrical configuration such that the axes thereof are aligned coincidentally to achieve the orientation depicted in FIG. 3. Attention is also directed to FIG. 5 for another illustration of aperture 37. In accordance with the teachings of the invention, the conductor 39, which forms part of the conductive layer 35, bridges aperture 37 in the manner shown in both FIGS. 3 and 5. This is considered a significant aspect of the present invention for reasons stated below. Although the embodiment of FIG. 5 illustrates the conductor 39 as completely bridging aperture 37, the teachings of the invention are readily adaptable to a thin flexible circuitized substrate wherein the conductor is also located substantially within aperture 37. One such example of this conductor-dielectric embodiment is illustrated in FIG. 7, wherein the conductor 39' is shown in the form of a plated-through-hole (PTH), examples of which are known in the art of printed circuit board technology. Understandably, conductor 39' includes a quantity of copper material located along the inner walls of aperture 37, which conductive material may extend over onto both upper and lower surfaces of the substrate's dielectric 33. Further, conductor 39 may assume other configurations than that depicted in FIG. 5. For example, suitable apertures, notches, indentations, etc. may be provided therein for enhanced flexibility during the manufacturing process. The conductor may also be curvilinear, rather than the substantially planar shape illustrated in FIG. 5.

Figure 3:
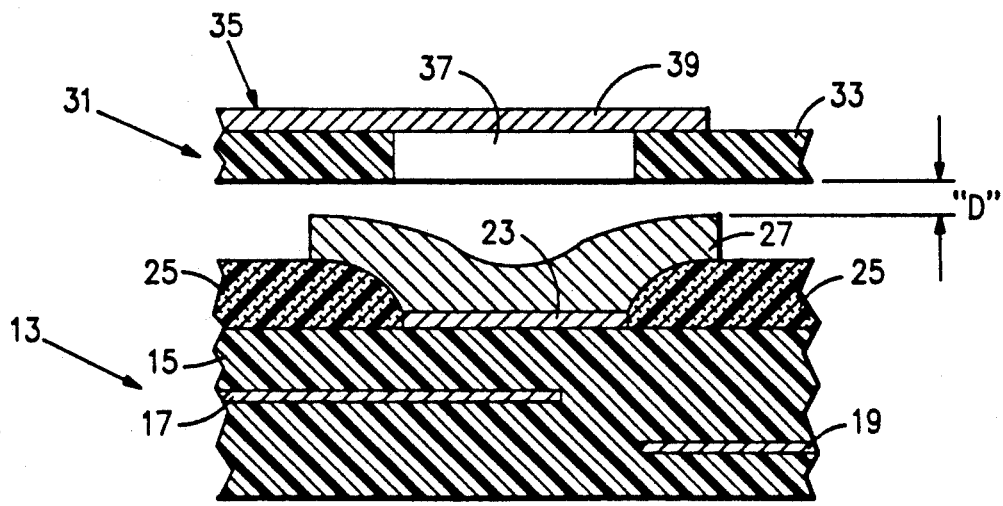

It is also understood from the teachings herein that the particular bridging location depicted in FIG. 5 is not meant to limit the invention, in that it is also possible to bond flexible substrates wherein the bridging conductor is located along a lower surface of the substrate's dielectric 33 in comparison to that depicted in FIGS. 3-5, one such example illustrated in FIG. 6. Thus, the invention is particularly adapted to flexible circuitized substrates possessing conductors as arranged in accordance with the examples illustrated in FIGS. 5-7. It is further understood that apertures 37 are not limited by the teachings of this invention to any number, size, shape or arrangement in flexible substrate 31. For example, apertures of oval or rectangular shape may be used. In one specific example, approximately 500 such apertures were arranged in a substantially square grid with spacings of about 0.050 inch on flexible substrate 31.

With both circuitized substrates 13 and 31 positioned in the manner described herein, the next step in the invention involves heating the substrates, preferably within an oven, to a predetermined temperature sufficient to cause solder paste 27 to "ball up" and form the substantially spherical configuration depicted in FIG. 4. This formation results in the formed solder member physically engaging the bridging conductor 39 for eventual permanent connection thereto. Significantly, the organic dewetting material 25 functions to assure that the defined solder will not wet thereto while also facilitating formation of the aforementioned spherical configuration. Use of this dewetting material, particularly of the configuration depicted in the drawings, assures ready formation of the solder paste 27 to the substantially spherical solder member (27') shown in FIG. 4. This is considered a significant aspect of the invention in that it not only assures a desired ultimate configuration for solder member 27' but also sound physical connection with both adjacent conductors 23 and 39.

The above heating of substrates 13 and 31, as stated, preferably occurs within an oven, one example of such a structure being an infrared continuous belt reflow oven, as are known in the art. Both substrates were located within the oven for a period of from about 1.5 minutes to about 5.0 minutes, depending on the soldering composition used. The temperature to which these substrates were heated ranged from about 170 degrees Celsius (C.) to about 225 degrees C. Significantly, these temperatures had no adverse affect on either organic substrate, both during this operation as well as during operation thereof subsequently.

Following he heating step defined above, both substrates were removed from the oven and allowed to cool, resulting in final solidification of the solder element 27'. The result of this method as defined above is a bonding between substrates 13 and 31 to provide sound electrical connection between respective electrical connectors thereof. Such a procedure, as defined, is relatively simple in operation and may thus be adapted to mass production techniques for greater cost effectiveness. In one example of the invention, a total of about 500 connections may be simultaneously provided between two circuitized substrates of the type defined herein.

In one example of the invention, a printed circuit board was utilized for substrate 13 and possessed an overall thickness of about 0.060 inch. Conductive pads 23 of copper were applied, each having an outer diameter of about 0.010 inch and a corresponding thickness of about 0.0014 inch. The defined Probimer 52 organic dewetting material was applied adjacent each pad, this material having a thickness of about 0.003 inch. A volume of about $3.1 \times 10^{-6}$ cubic inches of solder paste 27 was applied per conductive pad 23, using the defined screening technique. This solder paste material possessed an average thickness of about 0.010 inch. The corresponding flexible circuitized substrate was located at a distance ("D" in FIG. 3) of about 0.005 inch such that the exposed surface of conductor 39 (that facing pad 23) was at a distance of only about 0.018 inch from pad 23. Understandably, the above thicknesses and spacing are considered significant in order to attain the final bond and connection taught herein.

Figure 8:
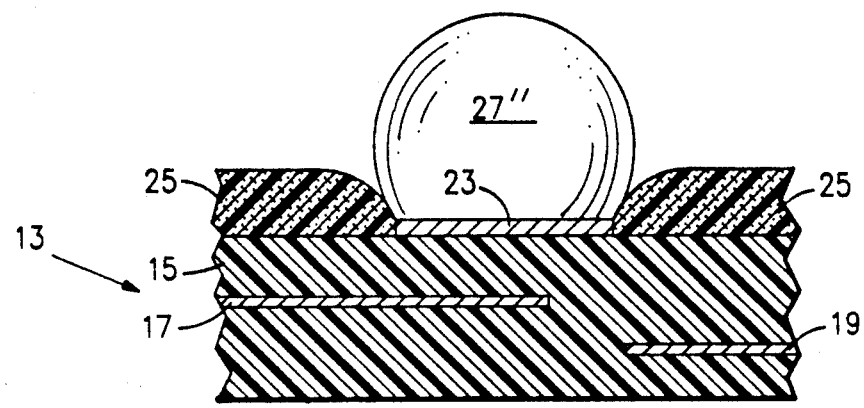
FIGS. 8-10 illustrate the various steps in bonding a pair of circuitized substrates to provide an electrical connection therebetween, in accordance with another embodiment of the invention.
Figure 9:
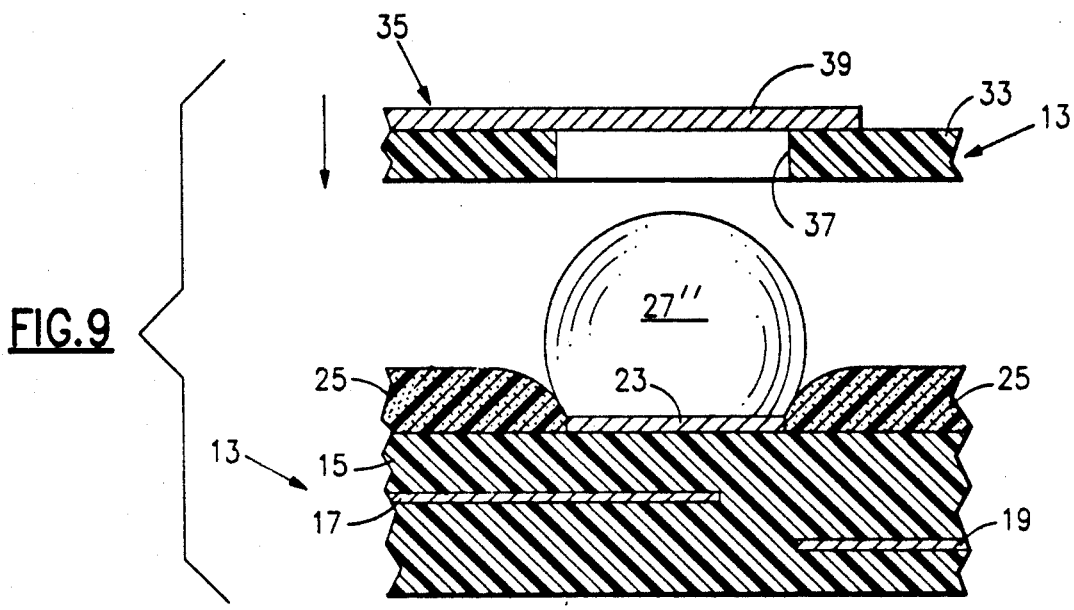
Figure 10:
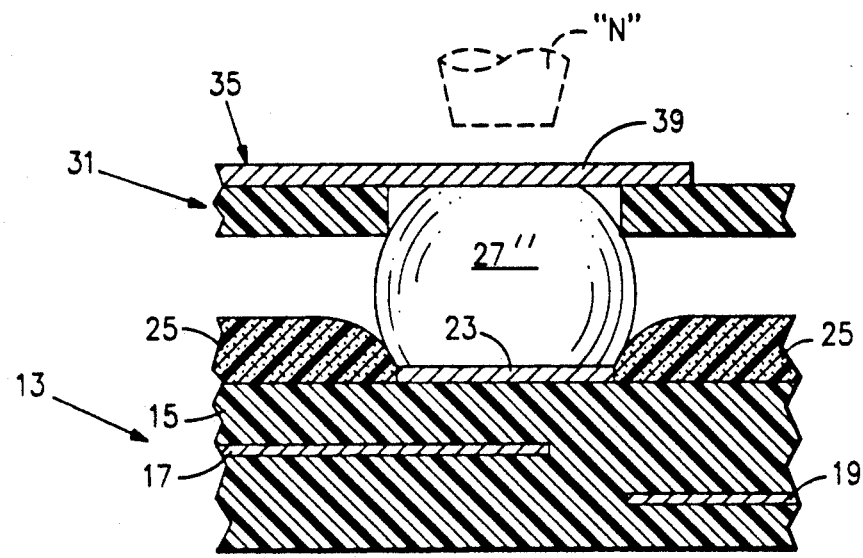

In FIGS. 8-10, there are shown the steps of connecting a pair of circuitized substrates in accordance with another embodiment of the invention. In FIG. 8, a solder member 27" has been formed similarly to the formation of solder member 27' in FIGS. 1-4, except that in the formation represented in FIG. 8, no flexible circuitized substrate is located adjacent the first substrate 13 having solder member 27" thereon. That is, substrate 13 in FIG. 8 is prepared substantially similar to the treatment of substrate 13 in FIGS. 1-4, excluding alignment of the adjacent flexible circuitized substrate. Solder member 27" thus assumes the spherical configuration depicted in FIG. 8 and is then allowed to cool to reach solidification.

In FIG. 9, the flexible circuitized substrate 31 is lowered such that the bridging conductor 39 physically engages the upper surface of member 27". Conductor 39 may be of any of the configurations of the various conductors depicted in FIGS. 5-7. With conductor 39 physically engaging solder member 27", heat is then applied to liquify (render molten) at least the upper portion of solder member 27' to cause it to further engage conductor 39, as depicted in FIG. 10. This assembly is then allowed to cool to provide the solidified bond and electrical connection of similar nature to that illustrated in FIG. 4. The desired temperature for heating solder member 27' is, understandably, dependent on the solder composition used In the event that 63:37 tin-lead solder is used, this temperature is preferably about 170 degrees C. to about 225 degrees C. A preferred technique for heating solder member 27" is to apply a hot gas (e.g., nitrogen) at a temperature of about 170 to about 225 degrees C. onto the bridging conductor 39 so as to heat this conductor, which heat is then transferred onto the engaging segment of solder member 27". Understandably, portions of this applied heated gas will also directly impinge on the solder member to further enhance liquification thereof. A minor amount of pressure (e.g., eight grams per solder member) may be applied to the flexible circuitized substrate during such heating. Should hot gas be applied, it would preferably pass through a nozzle ("N" in FIG. 10) located above conductor 39.

Figure 11:
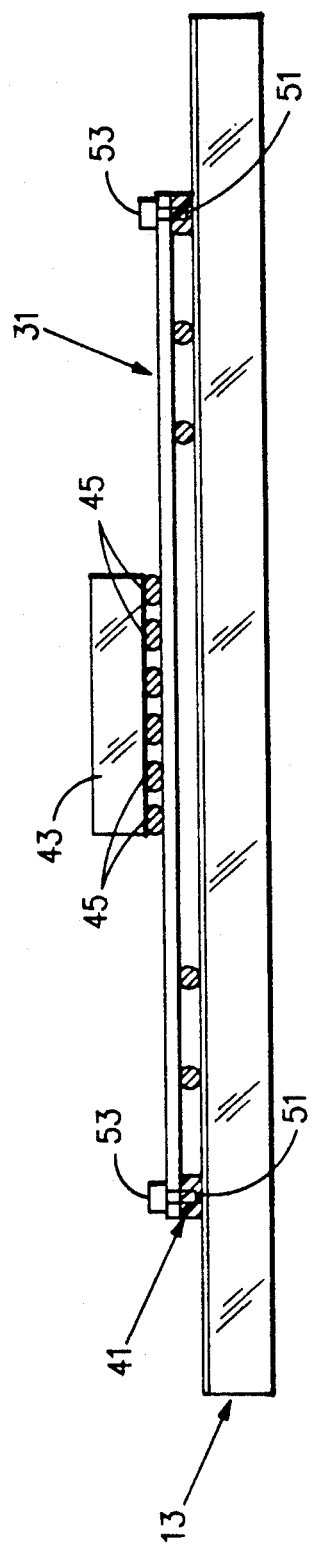
FIG. 11 is a plan view, on a reduced scale over those views in FIGS. 1-10, illustrating an electronic package produced in accordance with the teachings of the invention, the package in FIG. 11 shown to include a frame member as part thereof.

In FIG. 11, there is shown a frame member 41 which may be utilized in performing the steps of the present invention, particularly for the purpose of maintaining the thin flexible substrate 31 substantially parallel to the planar substrate 13 to which it is to be bonded and electrically connected. Prior to such attachment, however, the flexible substrate 31 is preferably electrically coupled to a semiconductor device (chip) 43 in a manner known in the art. Such a device may be electrically connected to respective circuitry (not shown) on substrate 31 using a plurality of solder joints 45, formed in accordance with known techniques of the art. One particular example of such a technique is referred to in the art as C4, standing for Controlled Collapse Chip Connection, wherein a plurality of solder balls are attached to respective contact sites on the chip and the chip then aligned with desired circuitry on the flexible substrate and bonded thereto. Again, examples of such a flexible circuitized substrate, including those having semiconductor devices thereon, are illustrated and defined in U.S. Pat. Nos. 4,849,856, 4,914,551 and 4,937,707.

With this flexible circuit so formed (having the semiconductor device thereon), the dielectric portion thereof is stretched across the frame 41 in the manner shown in FIG. 11. This may be accomplished by stretching the substrate's dielectric across opposing frame sides 51 and securing the peripheral edges of the substrate thereto. A preferred method for achieving such securement is to use a plurality of pins 53 which pass through provided apertures within the substrate's outer periphery and into capture holes located within the opposed sides 51. In a preferred embodiment of the invention, a substantially rectangularly shaped frame (having four substantially equal length sides 51) is utilized to accommodate a similarly configured circuitized substrate 31 having a semiconductor device electrically coupled at the approximate center thereof. Alternatively, substrate 31' may be retained on the frame sides 51 using an adhesive or the like, if a more permanent type of securement is desired. Once the substrate has been stretched across frame 41, this subassembly is then located on the upper surface of substrate 13 to assume the position depicted in FIG. 11. This may be accomplished using pins which project from the undersurface of the frame and which align with and are inserted within corresponding apertures within the board. Preferably, optical means are used for alignment. Once so positioned, the aforementioned solder bonding operations as illustrated in FIGS. 1-4 and 8-10 may occur. That is, the described stretching frame is used to facilitate positioning of the flexible circuitized substrate 31 at the appropriate step in the two methods illustrated in FIGS. 1-4 and 8-10. Use of such a frame 41 thus serves to strategically position the flexible thin substrate at the desired, critical distance from the planar circuitized substrate 13, as is essential to achieve the bonding method taught herein.

Frame 41 is preferably of plastic material, a suitable example being Ryton. Ryton is a trademark of the Phillips Petroleum Company. This is not meant to limit the invention, however, in that other materials, including stainless steel and copper may be used.

Thus there has been shown and described a method of bonding a pair of circuitized substrates in order to provide sound electrical connection therebetween. The method as taught herein is ideally suited for mass production to thus provide a cost effective means of providing the resulting products capable of using such circuitized substrates, preferred examples being electronic packages of the type described herein.

While there has been shown and described what are at present considered the preferred embodiments of the invention, it will be understood to those skilled in the art that various changes and modifications may be made therein without departing from the scope of the invention as defined by the appended claims.

What is claimed is:

1. A method of bonding first and second circuitized substrates to provide electrical interconnection therebetween, said method comprising:
   providing at least one conductive pad on a first substrate comprised of an organic dielectric material;
   providing a quantity of organic dewetting material of a predetermined configuration substantially adjacent said conductive pad;
   applying a quantity of solder paste over said conductive pad and at least part of said organic dewetting material;
   aligning a second substrate including a dielectric material having an aperture therein and at least one conductor located within and/or bridging said aperture relative to said first substrate such that said conductor is oriented adjacent said solder paste and at a spaced distance therefrom, said second substrate being flexible in nature;
   heating said first and second substrates to a temperature sufficient to cause said solder paste to dewet from said organic dewetting material and engage said conductor of said second substrate; and
   thereafter cooling said solder to form an electrical interconnection bond between said first and second substrates.

2. The method according to claim 1 wherein said solder paste is applied over said conductive pad and part of said organic dewetting material using a screening process.

3. The method according to claim 1 wherein said first and second substrates are heated to a temperature within the range of from about 170 degrees C. to about 225 degrees C.

4. The method according to claim 3 wherein said substrates are heated to said temperature for a period of from about 1.5 minutes to about 5 minutes.

5. The method according to claim 3 further including the step of placing said first and second substrates within an oven, said heating occurring within said oven.

6. The method according to claim 1 further including the step of stretching said second substrate across a frame member prior to said aligning thereof relative to said first substrate such that said second substrate will be aligned substantially parallel to said first substrate.

7. The method according to claim 6 further including the step of attaching said frame having said second substrate stretched thereacross to said first substrate.

8. A method of bonding first and second circuitized substrates to provide electrical interconnection therebetween, said method comprising:
   providing at least one conductive pad on a first substrate comprised of an organic dielectric material;
   providing a quantity of organic dewetting material of a predetermiend configuration on said first substrate substantially adjacent said conductive pad;
   applying a quantity of solder paste over said conductive pad and at least part of said organic dewetting material located on said first substrate;
   heating said first substrte to a temperature sufficient to cause said solder paste to dewet from said organic dewetting material and form a predetermined shape;
   aligning a second substrate including a dielectric material having an aperture therein and at least one conductor located within and/or bridging said aperture relative to said first substrate such that said conductor engages said solder formed to said predetermined shape, said second substrate being flexible in nature;

heating said solder at the location of engagement with said conductor to cause said solder at said location to become molten and further engage said conductor; and thereafter cooling said solder to form an electrical interconnection and bond between said first and second substrates.

9. The method according to claim 8 wherein said solder paste is applied over said conductive pad and part of said organic dewetting material using a screening process.

10. The method according to claim 8 wherein said first substrate is heated to a temperature within the range of from about 170 degrees C. to about 225 degrees C.

11. The method according to claim 10 wherein said first substrate is heated to said temperature for a period of from about 1.5 minutes to about 5 minutes.

12. The method according to claim 10 further including the step of placing said first substrate within an oven, said heating occurring within said oven.

13. The method according to claim 8 wherein said solder at the location of engagement with said conductor is heated to a temperature within the range of from about 170 degrees C. to about 225 degrees C.

14. The method according to claim 8 further including the step of stretching said second substrate across a frame member prior to said aligning thereof relative to said first substrate such that said second substrate will be aligned substantially parallel to said first substrate.

15. The method according to claim 14 further including the step of attaching said frame having said second substrate stretched thereacross to said first substrate.

* * * * *